(12) United States Patent
Fung

(10) Patent No.: US 10,276,572 B2
(45) Date of Patent: Apr. 30, 2019

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventor: Ka-Hing Fung, Zhudong Township (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/933,885

(22) Filed: Nov. 5, 2015

(65) Prior Publication Data

US 2017/0133375 A1    May 11, 2017

(51) Int. Cl.
*H01L 21/82*    (2006.01)
*H01L 27/092*   (2006.01)
(Continued)

(52) U.S. Cl.
CPC .. *H01L 27/0924* (2013.01); *H01L 21/823807* (2013.01); *H01L 21/823814* (2013.01);
(Continued)

(58) Field of Classification Search
CPC ........... H01L 21/823487; H01L 29/775; H01L 29/0669
(Continued)

(56) References Cited

U.S. PATENT DOCUMENTS

2007/0196973 A1* 8/2007 Park ................ H01L 21/823412
                                                                438/197
2007/0221956 A1   9/2007 Inaba
(Continued)

FOREIGN PATENT DOCUMENTS

KR    10-2015-0008680 A    1/2015
KR    10-2015-0122270 A   10/2015

OTHER PUBLICATIONS

S. Natarajan et al., "A 14nm Logic Technology Featuring 2nd-Generation FinFET Transistors, Air-Gapped Interconnects, Self-Aligned Double Patterning and a 0.0588 µm2 SRAM cell size," Logic Technology Development, Quality and Reliability Engineering, DTS, Intel Corporation, 3 pages.

(Continued)

*Primary Examiner* — Moazzam Hossain
*Assistant Examiner* — Omar F Mojaddedi
(74) *Attorney, Agent, or Firm* — McDermott Will & Emery LLP

(57) ABSTRACT

A semiconductor device includes a first channel region disposed over a substrate, a first source region and a first drain region disposed over the substrate and connected to the first channel region such that the first channel region is disposed between the first source region and the first drain region, a gate dielectric layer disposed on and wrapping the first channel region, a gate electrode layer disposed on the gate dielectric layer and wrapping the first channel region, and a second source region and a second drain region disposed over the substrate and below the first source region and the first drain region, respectively. The second source region and the second drain region are in contact with the gate dielectric layer. A lattice constant of the first source region and the first drain region is different from a lattice (Continued)

constant of the second source region and the second drain region.

20 Claims, 16 Drawing Sheets

(51) Int. Cl.
*H01L 29/165* (2006.01)
*H01L 21/8238* (2006.01)
*H01L 29/66* (2006.01)
*H01L 29/78* (2006.01)
*H01L 29/423* (2006.01)

(52) U.S. Cl.
CPC .... *H01L 21/823821* (2013.01); *H01L 27/092* (2013.01); *H01L 29/42392* (2013.01); *H01L 29/66545* (2013.01); *H01L 29/785* (2013.01); *H01L 29/165* (2013.01); *H01L 2029/7858* (2013.01)

(58) Field of Classification Search
USPC .................................................. 257/369, 288
See application file for complete search history.

(56) References Cited

U.S. PATENT DOCUMENTS

| | | | |
|---|---|---|---|
| 2008/0062112 A1* | 3/2008 | Umezaki ................ G09G 3/342 345/100 |
| 2012/0181625 A1* | 7/2012 | Kwok ................... H01L 29/165 257/408 |
| 2014/0151638 A1 | 6/2014 | Chang et al. |
| 2014/0225065 A1 | 8/2014 | Rachmady et al. |
| 2015/0014780 A1 | 1/2015 | Kim et al. |
| 2015/0228759 A1* | 8/2015 | Chen ................. H01L 29/66666 257/329 |
| 2015/0372145 A1* | 12/2015 | Cheng ................ H01L 29/1033 257/288 |
| 2016/0079422 A1 | 3/2016 | Rachmady et al. |
| 2016/0204277 A1* | 7/2016 | Yang ................... H01L 29/0676 438/151 |
| 2016/0240441 A1* | 8/2016 | Kang ................... H01L 29/775 |
| 2017/0018462 A1* | 1/2017 | Suk ................... H01L 29/78681 |

OTHER PUBLICATIONS

Office Action Korean Patent Application No. 10-2016-0021200 dated Feb. 27, 2017.

* cited by examiner

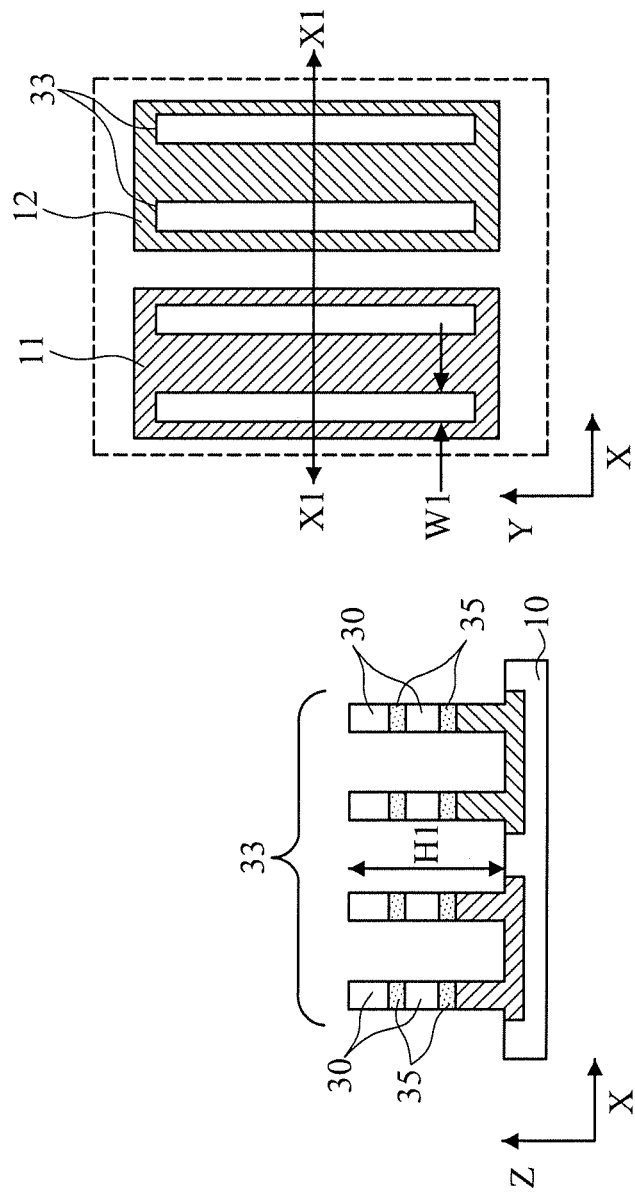

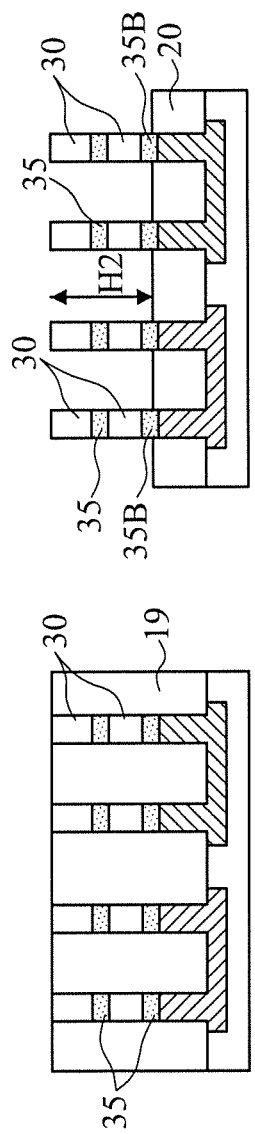

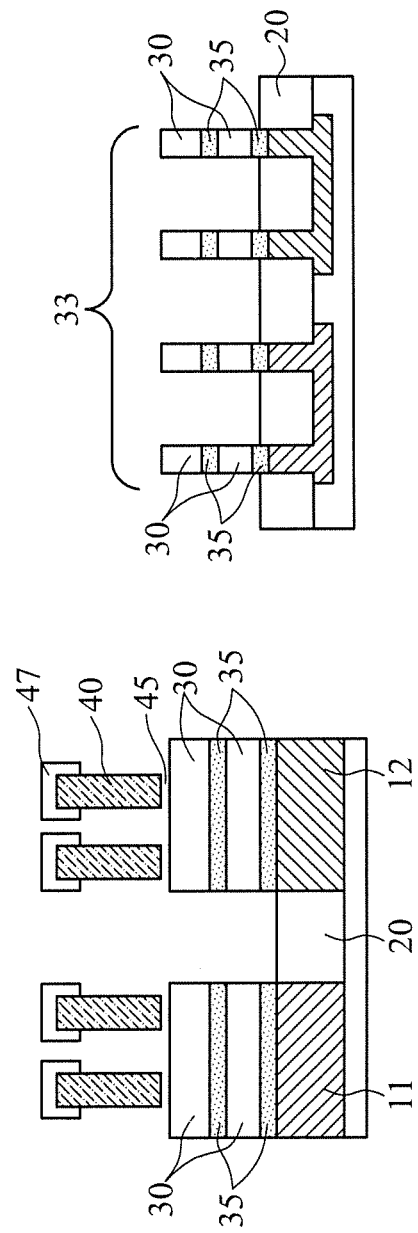

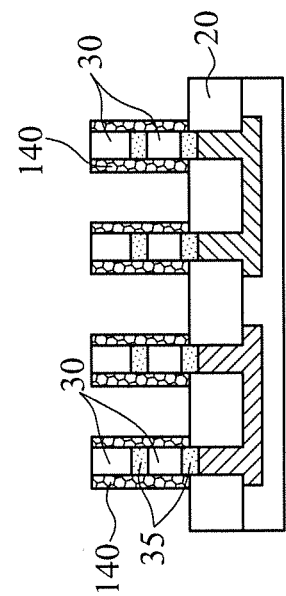
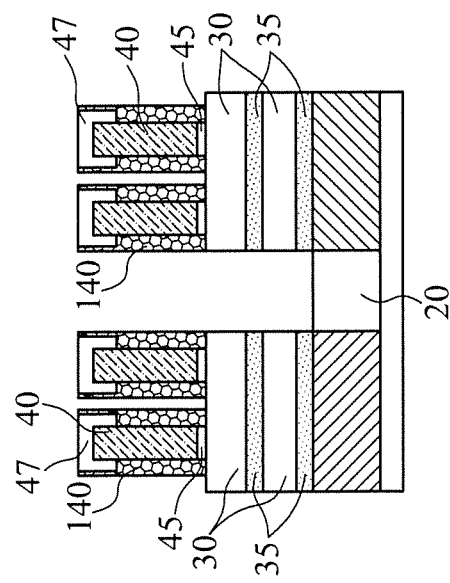
Fig. 8A
Fig. 8B

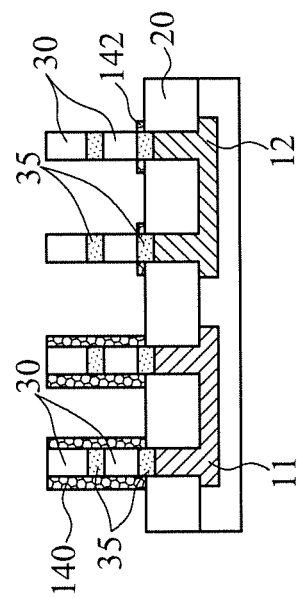
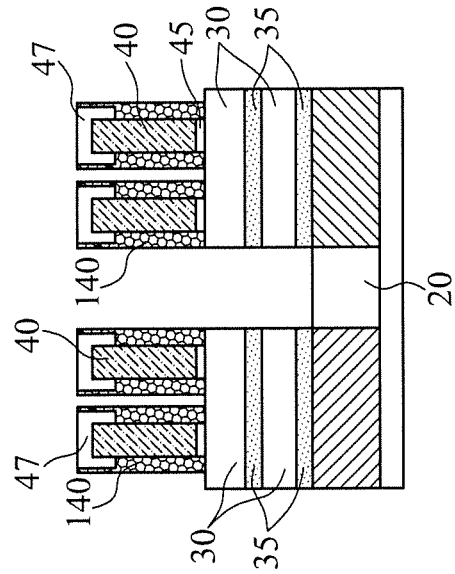
Fig. 9A
Fig. 9B

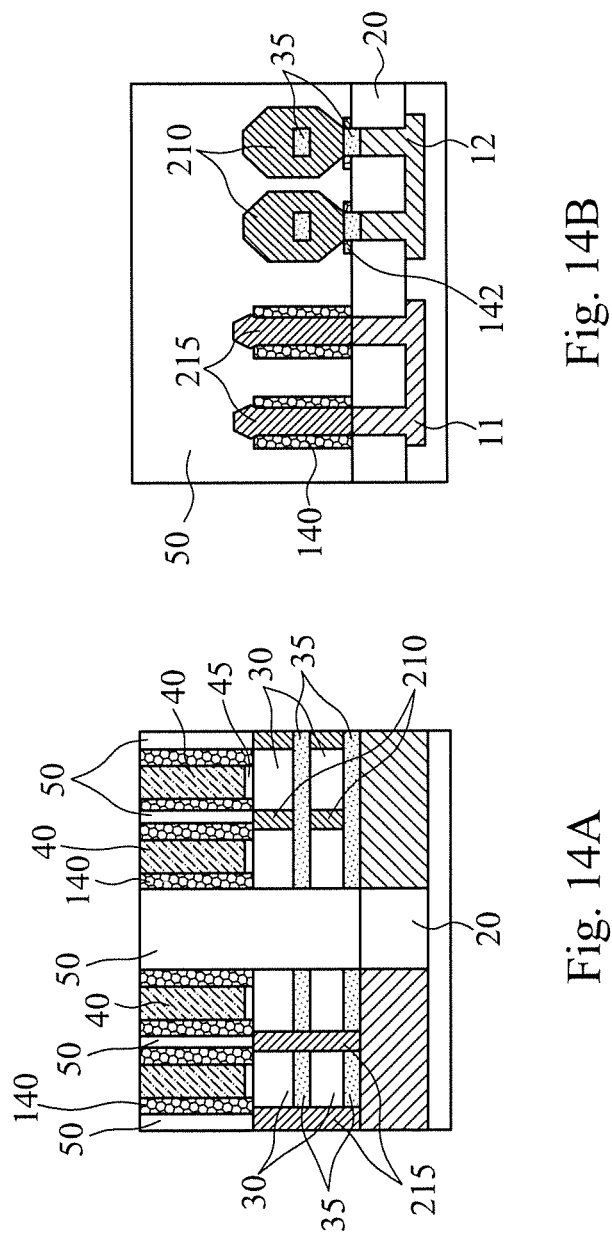

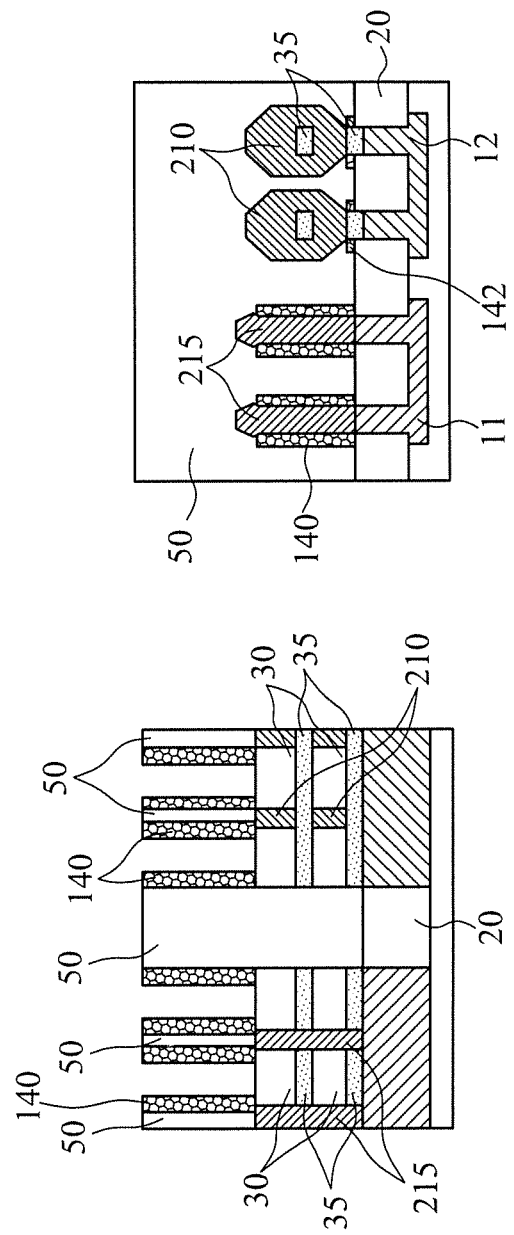

SEMICONDUCTOR DEVICE AND MANUFACTURING METHOD THEREOF

TECHNICAL FIELD

The disclosure relates to a semiconductor integrated circuit, and more particularly to a semiconductor device having a gate-all-around structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET) such as a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and result in less short-channel effects due to steeper sub-threshold current swing (SS) and smaller drain induced barrier lowering (DIBL).

As transistor dimensions are continually scaled down to sub 20-25 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1-17B show exemplary sequential processes for manufacturing the GAA FET device according to one embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

FIGS. 1-17B show exemplary sequential processes for manufacturing the GAA FET device according to one embodiment of the present disclosure. It is understood that additional operations can be provided before, during, and after processes shown by FIGS. 1-17B, and some of the operations described below can be replaced or eliminated, for additional embodiments of the method. The order of the operations/processes may be interchangeable.

A general manufacturing flow for forming a GAA FET is described in U.S. application Ser. No. 14/675,160, the entire contents of which is incorporated herein by reference.

Figure 1:
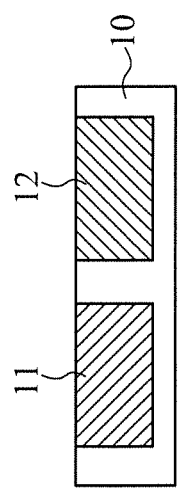

As shown in FIG. 1, a p-well 11 for n-channel FETs (n-channel region) and an n-well 12 for p-channel FETs (p-channel region) are formed in a substrate 10. In one embodiment, substrate 10 includes a single crystalline semiconductor layer on at least it surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 10 is made of Si.

In some embodiments, the substrate 10 includes in its surface region, one or more buffer layers. The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30% germanium for the bottom-most buffer layer to 70% germanium for the top-most buffer layer.

Figure 2:
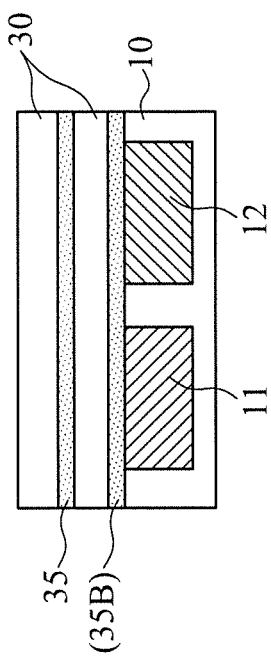

As shown in FIG. 2, stacked semiconductor layers are formed over the substrate. The stacked semiconductor layers include first semiconductor layers 30 and second semiconductor layers 35, which are sacrificial semiconductor layers. The first semiconductor layers 30 are subsequently formed into channel regions of the FET and the second semiconductor layers 35 are eventually removed. The first semiconductor layers 30 and the second semiconductor layers 35 are made of materials having different lattice constant, and may include one or more layers of such as, but not limited to Si, Ge, SiGe, GaAs, InSb, GaP, GaSb, InAlAs, InGaAs, GaSbP, GaAsSb and InP.

In some embodiments, the first semiconductor layers 30 and the second semiconductor 35 layers are made of Si, a Si compound, SiGe, Ge or a Ge compound. In one embodiment, the first semiconductor layers 30 are $Si_{1-x}Ge_x$, where x is more than about 0.3, or Ge and the second semiconductor layers 35 are Si or $Si_{1-x}Ge_x$, where x is less than about 0.4, and the Ge content of second semiconductor layers 35 is smaller than that of the first semiconductor layers 30. In another embodiment, the second semiconductor layers 35 are $Si_{1-x}Ge_x$, where x is more than about 0.3, or Ge, and the first semiconductor layers 30 are Si or $Si_{1-x}Ge_x$, where x is less than about 0.4, and the Ge content of the second semiconductor layers 35 is greater than that of the first semiconductor layers 30. In other embodiments, the first semiconductor layer 30 is made of $Si_{1-x}Ge_x$, where x is in a range from about 0.3 to about 0.8, and the second semiconductor layer 35 is made of $Si_{1-x}Ge_x$, where x is in a range from about 0.1 to about 0.4. In other embodiments, the second semiconductor layer 35 may be doped with boron.

In FIG. 2, two layers of the first semiconductor layer 30 and two layers of the second semiconductor layer 35 are disposed. However, the number of the layers are not limited to two, and may be as small as 1 (each layer) and more than two, and in some embodiments, 3-6 layers of each of the first and second semiconductor layers are formed. By adjusting the numbers of the second semiconductor layers, a driving current of the GAA FET device can be adjusted.

The first semiconductor layers 30 and the second semiconductor layers 35 are epitaxially formed over the substrate 10. The thickness of the semiconductor layers 30 is equal to or greater than that of the second semiconductor layers 35, and is in a range from about 5 nm to about 50 nm, or is in a range from about 10 nm to about 30 nm in some embodiments. The thickness of the second semiconductor layers 35 is in a range from about 5 nm to about 30 nm, or may be in a range from about 10 nm to about 20 nm. The thickness of the first semiconductor layers 30 may be the same with each other, or may vary.

In some embodiments, the bottom second semiconductor layer 35B (the closest layer to the substrate 10) is thicker than the remaining second semiconductor layers. The thickness of the bottom second semiconductor layer 35B is in a range from about 10 nm to about 50 nm in some embodiments, or is in a range from 20 nm to 40 nm in other embodiments.

Next, as shown in FIGS. 3A and 3B, the stacked layers of the first and second semiconductor layers 30, 35 are patterned using patterning operations including photo-lithography and etching, thereby the stacked layers are formed into fin structures 33 extending in the Y direction. FIG. 3B shows a plan view and the FIG. 3A corresponds to the line X1-X1 of FIG. 3B. A part of substrate 10 (p-well and n-well) is also etched so that the bottom portion of the fin structure includes a part of the substrate 10. In the etching, a mask pattern, such a photoresist pattern or a hard mask pattern including silicon oxide and/or silicon nitride can be used.

The width W1 of the fin structure along the X direction is in a range from about 20 nm to about 40 nm in some embodiments, and is in a range from about 25 nm to about 30 nm. The width W1 substantially defines the channel length of the GAA FET. The height H1 along the Z direction of the fin structure is in a range from about 100 nm to about 200 nm.

After the fin structure is formed, an insulating layer 19 including one or more layers of insulating material is formed over the substrate so that the fin structures 33 are fully embedded, as shown in FIG. 4. The insulating material for the insulating layer 19 may include silicon oxide, silicon nitride, silicon oxynitride (SiON), SiOCN, fluoride-doped silicate glass (FSG), or a low-K dielectric material. An anneal operation may be performed after the formation of the insulating layer 19. Then, a planarization operation, such as a chemical mechanical polishing (CMP) method and/or an etch-back method, is performed such that the upper surface of the fin structure is exposed from the insulating material layer.

Then, the insulating layer 19 is recessed to form an isolation layer 20 (or so-called "shallow-trench-isolation (STI)" layer) is formed, as shown in FIG. 5. In one embodiment, the upper surface of the isolation layer 20 is located at the bottom of the bottom second semiconductor layer 35B, as shown in FIG. 5. In other embodiment, the upper surface of the isolation layer 20 is located the between the upper surface and the lower surface of the bottom second semiconductor layer 35B. The height H2 along the Z direction of the fin structure from the upper surface of the isolation layer 20 is in a range from about 80 nm to about 120 nm.

Figures 6A, 6B:
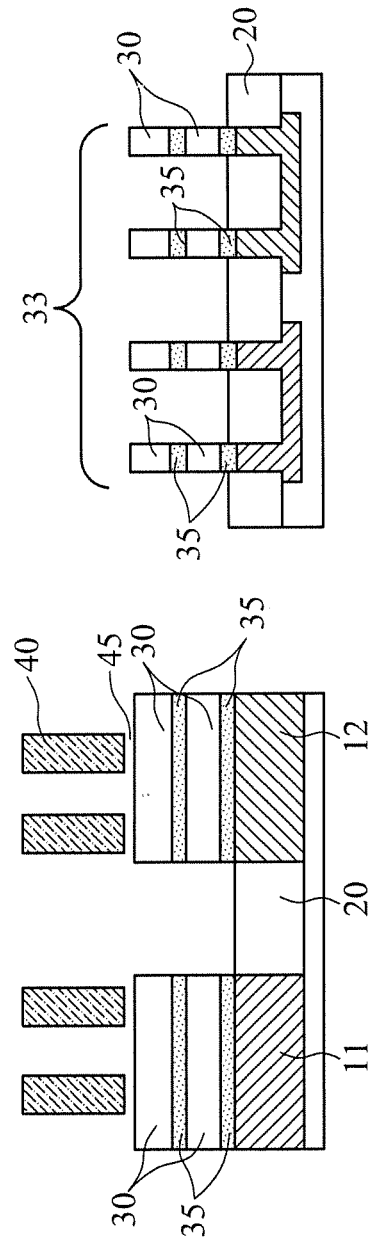
Figures 6C, 6D:
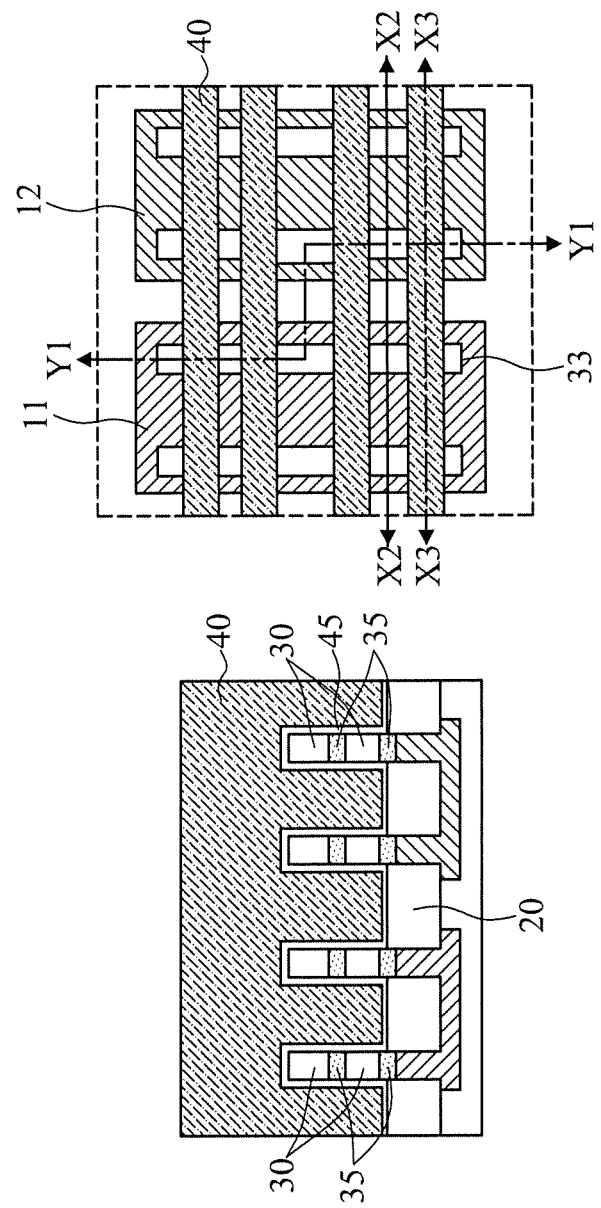

FIGS. 6A-6D illustrate a structure after a sacrificial gate structure is formed. FIG. 6D is a plan view, FIG. 6A is a cross sectional view along the line Y1-Y1 of FIG. 6D, FIG. 6B is a cross sectional view along the line X2-X2 of FIG. 6D, and FIG. 5C is a cross sectional view along the lines X3-X3 of FIG. 6D.

The sacrificial gate structure includes a sacrificial gate electrode 40 and a sacrificial gate dielectric layer 45. The sacrificial gate structure is formed over the fin structure where is to be a channel region. The sacrificial gate structure defines the channel region of the GAA FET.

The sacrificial gate structure is formed by first blanket depositing a sacrificial gate dielectric layer over the fin structure and the isolation layer 20. The sacrificial gate dielectric layer includes one or more layers of silicon oxide, silicon nitride or silicon oxynitride. The thickness of the sacrificial gate dielectric layer is in a range from about 1 nm to about 5 nm in some embodiments. A sacrificial gate electrode layer is then blanket deposited on the sacrificial gate dielectric layer and over the fin structure, such that the fin structure is fully embedded in the sacrificial gate electrode layer. The sacrificial gate electrode layer includes silicon such as poly crystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using chemical vapor deposition (CVD) including low pressure CVD (LPCVD) and plasma enhanced CVD (PECVD), physical vapor deposition (PVD), atomic layer deposition (ALD), or other suitable process.

Next, a patterning operation is performed so as to form the sacrificial gate electrode 40 and the sacrificial gate dielectric layer 45. The sacrificial gate structure serves to subsequently protect the channel region of the fin structure during the removal of the sacrificial semiconductor layers 35. By patterning the sacrificial gate structure, the stacked layers of the first and second semiconductor layer are partially exposed on opposite sides of the sacrificial gate structure, as shown in FIGS. 6A and 6B. The sacrificial gate dielectric layer serves as an etch stop layer during the patterning and formation of sacrificial gate electrode 40, thereby preventing fin from being damaged. The sacrificial gate dielectric layer is removed from the top and sidewalls of the fin structure using a dry and/or wet etch process.

After the sacrificial gate structure is formed, a protection cap 47 is formed over the top of the sacrificial gate electrode 40, as shown in FIG. 7A. FIG. 7A is a cross sectional view corresponding to the line Y1-Y1 of FIG. 6D, and FIG. 7B is a cross sectional view corresponding to the line X2-X2 of FIG. 6D. The protection cap 47 is an optional structure, and in some embodiment, no protection cap 47 is formed.

Further, side wall spacer layers 140 are formed on opposite sidewalls of the sacrificial gate structure, shown in FIGS. 8A and 8B. FIG. 8A is a cross sectional view corresponding to the line Y1-Y1 of FIG. 6D, and FIG. 8B is a cross sectional view corresponding to the line X2-X2 of FIG. 6D.

The sidewall spacer layers 140 may be formed using CVD or other suitable process. In one embodiment, a conformal dielectric spacer layer, such as, but not limited to, a silicon nitride based material including SiN, SiON, SiOCN or SiCN and combinations thereof, is first blanket deposited over all structures. The dielectric spacer layer is deposited in a conformal manner so that it forms to substantially equal thicknesses on both vertical surfaces, such as the sidewalls, and horizontal surfaces, such as the top of the sacrificial gate structure. In some embodiments, the dielectric spacer layer is deposited to a thickness in a range from about 2 nm to about 10 nm. Next, anisotropic etching is performed on the dielectric spacer layer using, for example, reactive ion etching (RIE). During the anisotropic etching process, most of the dielectric spacer layer is removed from horizontal surfaces, leaving the dielectric spacer layer on the vertical surfaces such as the sidewalls of the sacrificial gate structure and the sidewalls of the exposed fin. Next, isotropic etching is performed to remove the remaining dielectric spacer layer from the sidewalls of the exposed fin structure, leaving the sidewall spacer layers 140 on opposite sidewalls of the sacrificial gate structure. In an embodiment, the isotropic etch is a wet etch process.

Then, sidewall spacer layers 140 formed over the n-well 12 (i.e., p-channel region) are removed, as shown in FIG. 9B. FIG. 9A is a cross sectional view corresponding to the line Y1-Y1 of FIG. 6D, and FIG. 9B is a cross sectional view corresponding to the line X2-X2 of FIG. 6D.

The sidewall spacer layers 140 can be removed by dry etching and/or wet etching. During the etching operation, the fin structures formed over the p-well 11 (i.e., n-channel FET region) is covered by, for example, a photo resist layer. Further, the sidewall spacer layers 140 disposed on the sacrificial gate structure 40, 45 are protected from the etching by the protection cap 47.

In some embodiments, as shown in FIG. 9B, a small piece 142 of the sidewall spacer layers 140 remains near the surface of the isolation layer 20. In other embodiments, the sidewall spacer layers 140 are completely removed from the fin structures over the n-well 12 (i.e., p-channel FET region).

Figures 10A, 10B:
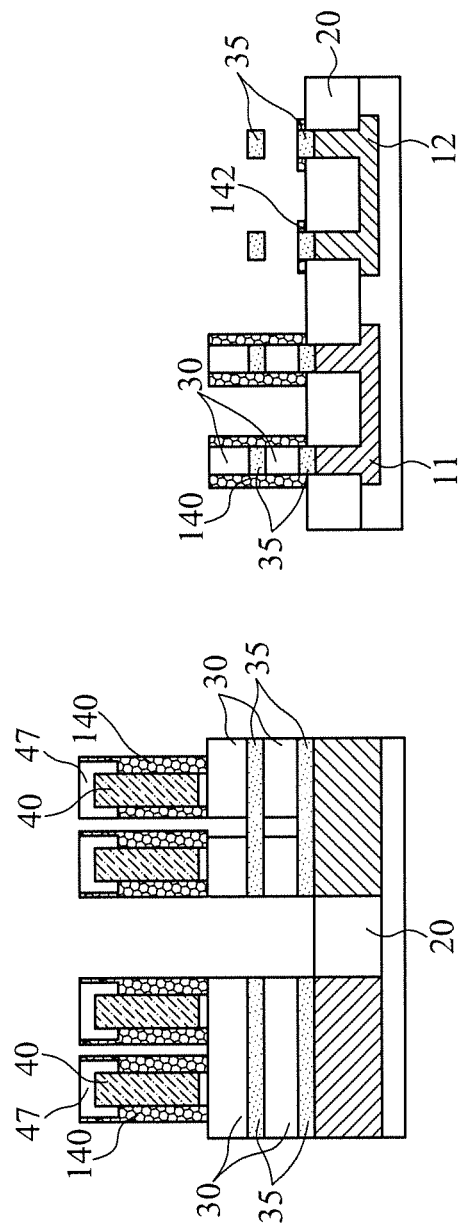

After removing the sidewall spacer layer 140 from the fin structures for p-channel FET, the first semiconductor layers 30 are removed from the fin structures for p-channel FETs not covered by the gate structures, as shown in FIGS. 10A and 10B. FIG. 10A is a cross sectional view corresponding to the line Y1-Y1 of FIG. 6D, and FIG. 10B is a cross sectional view corresponding to the line X2-X2 of FIG. 6D.

The first semiconductor layer 30 can be removed using etchant that can selectively etch the first semiconductor layers 30 against the second semiconductor layers 35.

When the first semiconductor layers 30 are Ge or a Ge-based compound and the second semiconductor layers 35 are Si or SiGe, the first semiconductor layers 30 can be selectively removed using a wet etchant such as, but not limited to ammonium hydroxide ($NH_4OH$), tetramethylammonium hydroxide (TMAH), ethylenediamine pyrocatechol (EDP), or potassium hydroxide (KOH) solution.

When the first semiconductor layers 30 are Si or a Si-based compound and the second semiconductor layers 35 are Ge or SiGe, the first semiconductor layers 30 can be selectively removed using a wet etchant such as, but not limited to ammonium hydroxide ($NH_4OH$), tetramethylammonium hydroxide (TMAH), ethylenediamine pyrocatechol (EDP), or potassium hydroxide (KOH) solution.

As shown in FIG. 10A, the first semiconductor layer 30 under the gate structures are not removed by this operation.

Figures 11A, 11B:
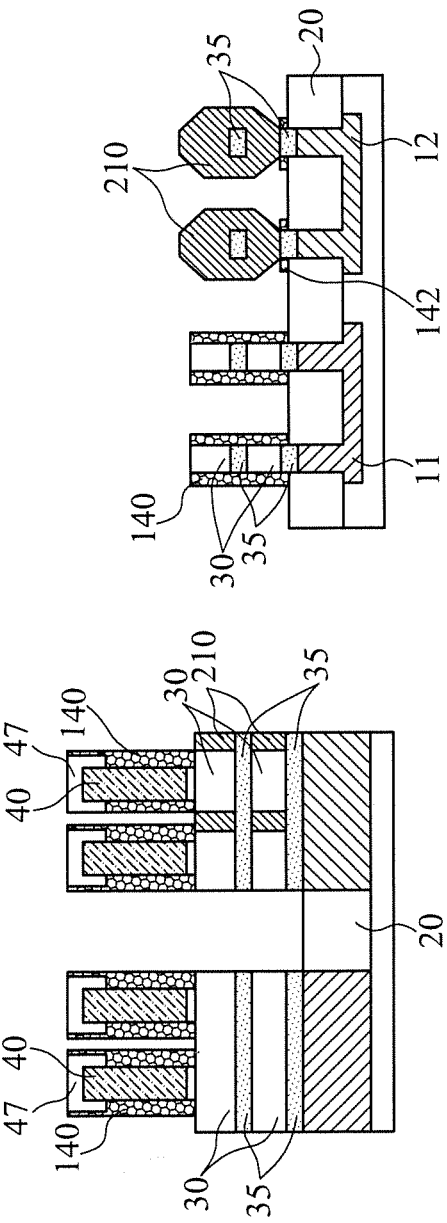

Then, first source/drain (S/D) layers 210 for p-channel FETs are formed on and around the second semiconductor layer 35 in the p-channel region, as shown in FIGS. 11A and 11B. FIG. 11A is a cross sectional view corresponding to the line Y1-Y1 of FIG. 6D, and FIG. 11B is a cross sectional view corresponding to the line X2-X2 of FIG. 6D. The materials for the first S/D layers 210 may be one or more of Si, Ge, SiGe, GeSn, GaAs, InSb, GaP, GaSb, InAlAs, InGaAs, GaSbP, GaAsSb, GaN, GaP, and InP.

In this embodiment, the first S/D layers 210 include $Si_{1-x}Ge_x$, where x is equal to or greater than 0.3, and in some embodiments, x is in a range from about 0.3 to about 0.8. $Si_{1-x}Ge_x$ may be simply referred to as SiGe in this disclosure.

Figure 12B:
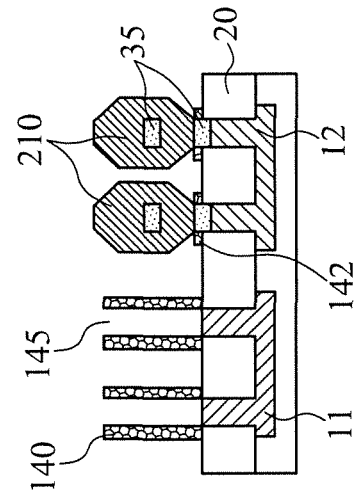
Figure 12A:
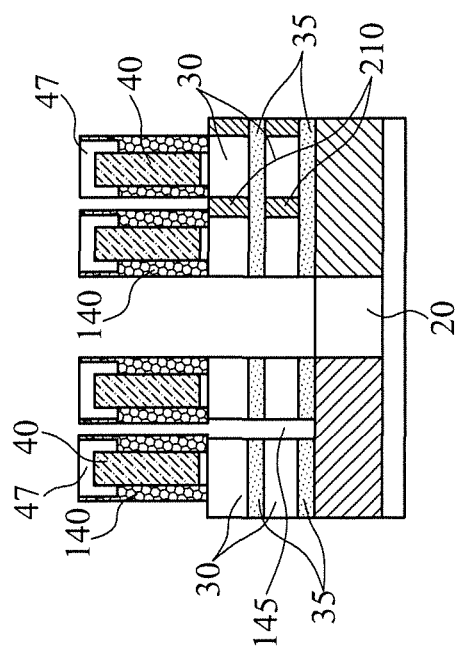

After the p-channel S/D structures are formed, as shown in FIGS. 12A and 12B, the fin structures for n-channel FETs over the p-well 11, which include first and second semiconductor layers 30 and 35, are removed. FIG. 12A is a cross sectional view corresponding to the line Y1-Y1 of FIG. 6D, and FIG. 12B is a cross sectional view corresponding to the line X2-X2 of FIG. 6D. Thus, spaces 145 defined by the sidewall spacer layers 140 are formed.

Figure 13B:
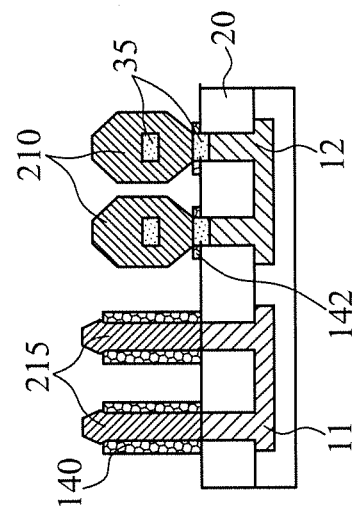
Figure 13A:
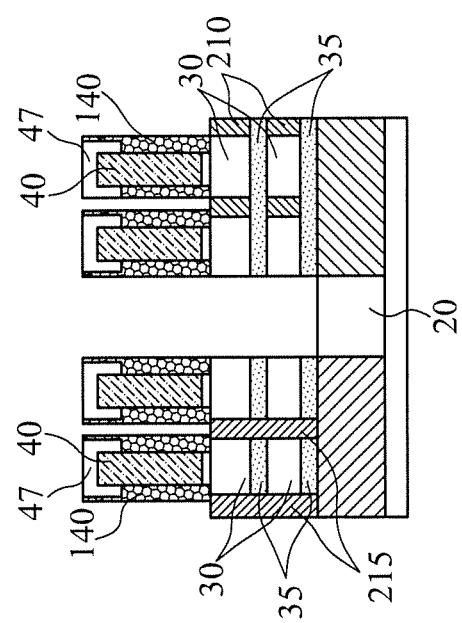

Then, second S/D layers 215 are formed in the spaces 145, as shown in FIGS. 13A and 13B. FIG. 13A is a cross sectional view corresponding to the line Y1-Y1 of FIG. 6D, and FIG. 13B is a cross sectional view corresponding to the line X2-X2 of FIG. 6D. The materials for the first S/D layers 210 may be one or more of Si, Ge, SiGe, GeSn, GaAs, InSb, GaP, GaSb, InAlAs, InGaAs, GaSbP, GaAsSb, GaN, GaP, and InP. In this embodiment, the second S/D layers 215 include $Si_{1-x}Ge_x$, where x is equal to or greater than about 0.4, and in some embodiments, x is greater than about 0.7 to about 1.0.

After the S/D structures for the n-channel FETs are formed, an interlayer dielectric layer (ILD) 50 is formed over the entire structures and then the upper portion of the interlayer dielectric layer 50 is planarized by a CMP operation so that the upper surface of the gate sacrificial electrode layer 40 is exposed, as shown in FIGS. 14A and 14B. FIG. 14A is a cross sectional view corresponding to the line Y1-Y1 of FIG. 6D, and FIG. 14B is a cross sectional view corresponding to the line X2-X2 of FIG. 6D.

The materials for the ILD layer 50 may include compounds comprising Si, O, C and/or H, such as SiCOH and SiOC. Organic material such as polymers may be used for the ILD layer 50.

The sacrificial gate electrode 40 and sacrificial gate dielectric layer 45 are removed, as shown in FIGS. 15A and 15B, thereby exposing the fin structures. FIG. 15A is a cross sectional view corresponding to the line Y1-Y1 of FIG. 6D, and FIG. 15B is a cross sectional view corresponding to the line X2-X2 of FIG. 6D.

The ILD layer 50 protects the first and second S/D structures 210 and 215 during the removal of the sacrificial gate structures. The sacrificial gate structures can be removed using plasma dry etching and/or wet etching. When the sacrificial gate electrode 40 is polysilicon and the ILD layer 50 is silicon oxide, a wet etchant such as a TMAH solution can be used to selectively remove the sacrificial gate electrode 40. The sacrificial gate dielectric layer 45 is thereafter removed using plasma dry etching and/or wet etching. By removing the sacrificial gate structures, side faces of the first semiconductor layers 30 and the second semiconductor layers 35 are exposed.

Figures 16A, 16B:
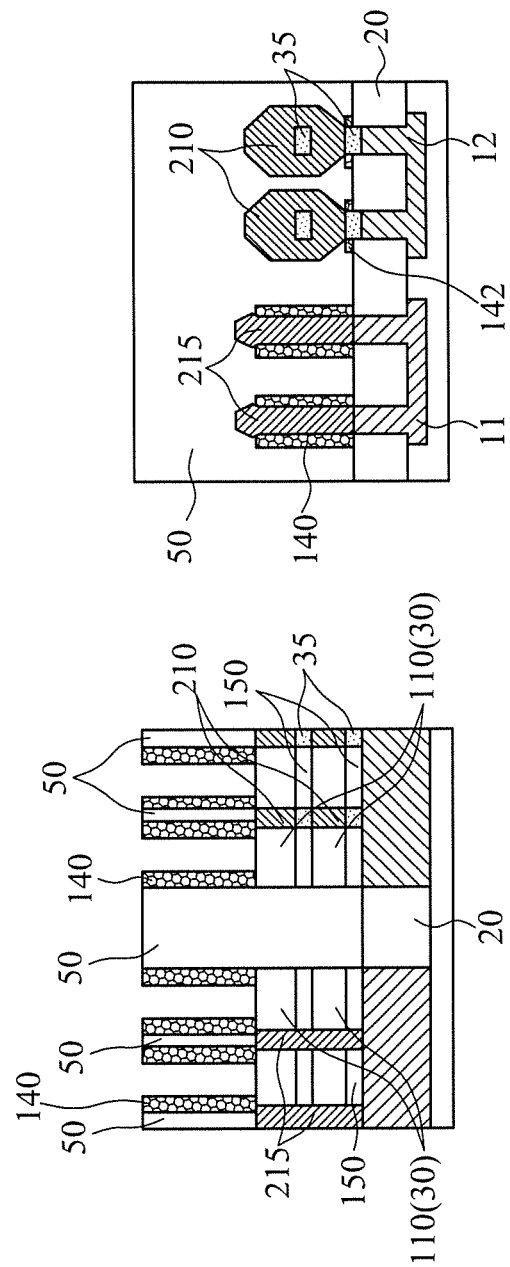

The second semiconductor layers 35 located between the first semiconductor layers 30 in the exposed fin structure are removed to form spaces 150, thereby forming wire-like or bar-like channel regions 110, as shown in FIG. 16A. FIG. 16A is a cross sectional view corresponding to the line Y1-Y1 of FIG. 6D, and FIG. 16B is a cross sectional view corresponding to the line X2-X2 of FIG. 6D.

The second semiconductor layer 35 can be removed using etchant that can selectively etch the sacrificial semiconductor layers 35 against the first semiconductor layers 30.

When the first semiconductor layers 30 are Ge or a Ge-based compound and the sacrificial semiconductor layers 35 are Si or SiGe, the sacrificial semiconductor layers 35 can be selectively removed using a wet etchant such as, but not limited to ammonium hydroxide ($NH_4OH$), tetramethylammonium hydroxide (TMAH), ethylenediamine pyrocatechol (EDP), or potassium hydroxide (KOH) solution.

When the first semiconductor layers 30 are Si or a Si-based compound and the sacrificial semiconductor layers 35 are Ge or SiGe, the sacrificial semiconductor layers 35 can be selectively removed by using a wet etchant such as, but not limited to aqueous carboxylic acid/nitric acid/HF solution and aqueous citric acid/nitric acid/HF solution.

By removing the second semiconductor layers 35, spaces or voids 150 are formed between the first semiconductor layers 30 (channel regions 110). The spaces or voids 150 between the first semiconductor layers 30 have a thickness in a range from about 5 nm to about 30 nm.

The remaining the first semiconductor layers 30 form a vertical array of channel regions 110, each of which is coupled to corresponding one of the first S/D layers 210 in the p-channel region, and the second S/D layer 215 in the n-channel region. It is noted that the materials for the channel regions 110 has a lattice constant different from the material for the first S/D layers 210 and 215. The channel regions 110 have a thickness in a range from about 5 nm to about 50 nm in one embodiment, and have a thickness in a range from about 5 nm to about 30 nm in other embodiments.

Figures 17A, 17B:
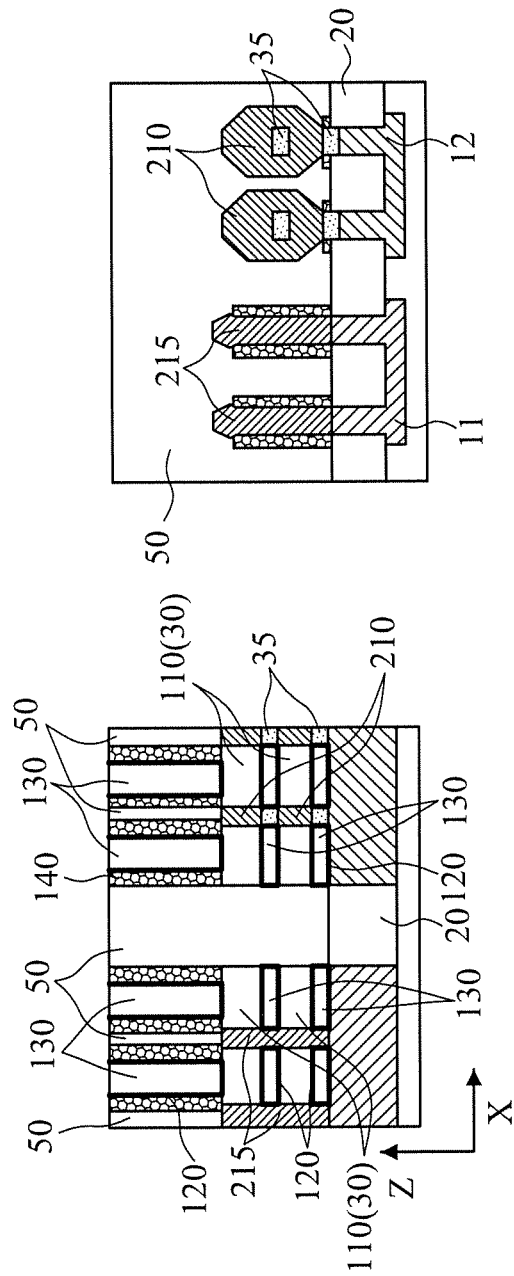

After the spaces 150 are formed, a gate dielectric layer 120 is formed around each channel regions 110, and a gate electrode layer 130 is formed on the gate dielectric layer 120, as shown in FIG. 17A. FIG. 17A is a cross sectional view corresponding to the line Y1-Y1 of FIG. 6D, and FIG. 17B is a cross sectional view corresponding to the line X2-X2 of FIG. 6D.

In certain embodiments, the gate dielectric layer 120 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HMO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate dielectric layer 120 may be formed from CVD, ALD or any suitable method. In one embodiment, the gate dielectric layer 120 is formed using a highly conformal deposition process such as ALD in order to ensure the formation of a gate dielectric layer having a uniform thickness around each channel regions 110. The thickness of the gate dielectric layer 120 is in a range from about 1 nm to about 6 nm in one embodiment. The gate dielectric layer 120 is also formed over the surface of the ILD layer 50 (not shown).

The gate electrode layer 130 is formed on the gate dielectric layer 120 to surround each channel region 110.

The gate electrode 130 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 130 may be formed from CVD, ALD, electro-plating, or other suitable method. The gate electrode layer is also deposited over the upper surface of the ILD layer 50. The gate dielectric layer and the gate electrode layer formed over the ILD layer 50 is then planarized by using, for example, CMP, until the top surface of the ILD layer 50 is revealed as shown in FIG. 17A.

In certain embodiments of the present disclosure, one or more work function adjustment layers (not shown) are interposed between the gate dielectric layer 120 and the gate electrode 130. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

By forming the gate electrode layer 130, the spaces 150 are fully filled by the material of the gate electrode layer 130. In some embodiments, the spaces 150 are not fully filled, thereby forming voids or slits.

In the above embodiments, the number of channel regions 110 (30) in the vertical direction for one FET is two. However, the number of channel regions may be three or more. In such a case, the number of second semiconductor layer 35 in the vertical direction also increases.

In the above embodiments, the S/D structures for the p-channel FETs are first formed and then those for the n-channel FETs are formed. In other embodiments, the S/D structures for the n-channel FETs are first formed and then those for the p-channel FETs are formed.

Referring to FIGS. 17A and 17B, the GAA FET devices are disposed over the substrate 10. The p-channel GAA FET includes a gate structure (120 and 130), channel regions 110 and source/drain regions 210 and the n-channel GAA FET includes a gate structure (120 and 130), channel regions 110, and source/drain regions 215.

Channel regions 110 extending in the X direction are disposed between the source regions and the drain regions. The gate structures extending in the Y direction include a gate dielectric layer 120 and a gate electrode layer 130. The gate dielectric layer 120 is formed on and all-around side surfaces of each channel region 110, except at the ends of channel regions 110 in the X direction, where channel regions 110 are coupled to the source and drain regions 210 or 215. A gate electrode layer 130 is formed on the gate dielectric layer 120 and completely surrounds each of the channel regions 110. The gate structure further includes sidewall spacer layers 140 disposed on the gate dielectric layer 120. Under the gate structure, the channel regions 110 wrapped with the gate dielectric layer 120 and the gate electrode layer 130 are discretely disposed.

The source/drain (S/D) regions of the p-channel FET include first S/D layers 210 and second S/D layers 35 (made by second semiconductor layers) stacked alternately in the Z direction. The first S/D layers 210 are coupled to the channel regions 110, respectively, and side surfaces (lateral ends in the X direction) of the second S/D layers 35 are in contact with the gate dielectric layer and are not in contact with the channel regions 110.

As shown in FIG. 17A, the location in the vertical direction (Z direction) of each channel region 110 is substantially the same as the location of each first S/D layer 210. The spaces between the adjacent channel regions 110 in the vertical direction, which are filled by the gate electrode layer 130 and the gate dielectric layer 120, are located at the substantially the same height as the second S/D layers 35.

In some embodiments, the channel region 110 includes a doped or un-doped Si or a Si-based compound, and the first S/D layer 210 includes Ge or $Si_{1-x}Ge_x$ with or without an additional dopant such as boron (B), where the content of Si is smaller than the content of Si in the channel region 110. When the channel regions 110 are not doped, scattering of charged carriers can be minimized and carrier mobility in the channel regions 110 can be increased. In one embodiment, the channel region 110 is made of Si. The second S/D layer 35 may also include $Si_{1-x}Ge_x$, where the amount of Ge is smaller than that of the first S/D layer 210. In one embodiment, the first S/D layer 210 includes $Si_{1-x}Ge_x$, where x is in a range from about 0.3 to about 0.8, and the second S/D layer 35 includes $Si_{1-y}Ge_y$, where y is in a range from about 0.1 to about 0.4, and y<x.

In other embodiments, the channel region 110 includes a doped or un-doped germanium (Ge) or a Ge-based compound, and the first S/D layer 210 includes Si or $Si_{1-x}Ge_x$ with or without an additional dopant such as boron (B), where the content of Ge is smaller than the content of Ge in the channel region 110.

It is understood that the GAA FETs undergoes further CMOS processes to form various features such as contacts/vias, interconnect metal layers, dielectric layers, passivation layers, etc.

The various embodiments or examples described herein offer several advantages over the existing art. For example, in the present disclosure, by using the stacked structure in the source/drain regions, it is possible to make the Ge content in the source and drain connected to the channel region higher compared with the case where source/drain regions are made of a single layer of $Si_{1-x}Ge_x$. Further, it is realized that the content of Ge is more uniform in one layer, which can provide a higher stress to the channel region, and thereby improving the device performance.

It will be understood that not all advantages have been necessarily discussed herein, no particular advantage is required for all embodiments or examples, and other embodiments or examples may offer different advantages.

In accordance with one aspect of the present disclosure, a semiconductor device includes a first channel region disposed over a substrate, a first source region and a first drain region disposed over the substrate and connected to the first channel region such that the first channel region is disposed between the first source region and the first drain region, a gate dielectric layer disposed on and wrapping the first channel region, a gate electrode layer disposed on the gate dielectric layer and wrapping the first channel region, and a second source region and a second drain region disposed over the substrate and below the first source region and the first drain region, respectively. The second source region and the second drain region are in contact with the gate dielectric layer. A lattice constant of the first source region and the first drain region is different from a lattice constant of the second source region and the second drain region.

In accordance with another aspect of the present disclosure, a semiconductor device includes a p-channel FET and an n-channel FET. Each of the p-channel FET and the n-channel FET comprises a fin structure disposed over a substrate, a gate structure partially covering the fin structure, and a source and drain (S/D) structure formed over the fin structure not covered by the gate structure. The gate structure of each of the p-channel FET and the n-channel FET includes a first channel region disposed over the substrate, a gate dielectric layer disposed on and wrapping the first channel region, and a gate electrode layer disposed on the gate dielectric layer and wrapping the first channel region. In the p-channel FET, the S/D structure includes a first S/D layer and a second S/D layer having a different lattice constant from than the first S/D layer, the first S/D layer is connected to the first channel region, the first S/D layer has a different lattice constant than the first channel region, and a side face of the second S/D layer are in contact with the gate dielectric layer.

In accordance with another aspect of the present disclosure, a method for manufacturing a semiconductor device includes the following operations. A first semiconductor layer sandwiched by second semiconductor layer in a vertical direction is formed over a substrate. The first semiconductor layer and the second semiconductor layers are patterned into a fin structure such that the fin structure includes sacrificial layers made by the second semiconductor layer and a channel region made by the first semiconductor layer. A sacrificial gate structure is formed over the fin structure such that the sacrificial gate structure covers a part of the fin structure while remaining parts of the fin structure remain exposed. The remaining parts of the fin structure, which are not covered by the sacrificial gate structure, are removed. A source/drain region is formed. The sacrificial gate structure is removed. The sacrificial layer in the fin structure is removed after removing the sacrificial gate structure so that the channel region is exposed. A gate dielectric layer and a gate electrode layer are formed around the exposed channel region. The forming the source/drain (S/D) region includes operations of: removing the first semiconductor layer so that at least one of the second semiconductor layer is exposed; and forming a first S/D layer on and around the exposed second semiconductor layer. The first S/D layer is connected to the channel region, a side face of the second semiconductor layer in the S/D region is in contact with the gate dielectric layer, and a lattice constant of the first S/D layer is different from a lattice constant of the second semiconductor layer and from a lattice constant of the channel region.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device including a gate-all-around field effect transistor (GAA FET), the GAA FET comprising:
   a first channel region disposed over a substrate;
   a first source region and a first drain region disposed over the substrate and connected to the first channel region such that the first channel region is disposed between the first source region and the first drain region along a first direction;
   a gate dielectric layer disposed on the first channel region;
   a gate electrode layer disposed on the gate dielectric layer; and
   a second source region and a second drain region disposed over the substrate wherein:
   the second source region and the second drain region are in contact with the gate dielectric layer,
   a lattice constant of the first source region and the first drain region is different from a lattice constant of the second source region and the second drain region, and
   when viewed in a cross section perpendicular to the first direction, the first source region completely surrounds the second source region, and the first drain region completely surrounds the second drain region.

2. The semiconductor device of claim 1, wherein:
   a space is provided between the first channel region and the substrate in a vertical direction perpendicular to a surface of the substrate and between the second source region and the second drain region in a horizontal direction parallel to the surface of the substrate, and
   the space is filled with the gate dielectric layer and the gate electrode.

3. The semiconductor device of claim 1, wherein:
   the first channel region is made of Si or a Si-based compound, and
   the first source region and the first drain region are made of Ge or SiGe.

4. The semiconductor device of claim 3, wherein:
   the second source region and the second drain region are made of SiGe, and
   a Ge content of the second source region and the second drain region is smaller than a Ge content of the first source region and the first drain region.

5. The semiconductor device of claim 1, the GAA-FET further comprises:
   a second channel region disposed over the first channel region with a space filled with the gate dielectric layer and the gate electrode, the gate dielectric layer and the gate electrode being disposed over the second channel region;
   a third source region disposed over the first source region, and a third drain region disposed over the first drain region;
   a fourth source region disposed over the third source region and connected to the second channel region; and
   a fourth drain region disposed over the third source region and connected to the second channel region such that the second channel region is disposed between the fourth source region and the fourth drain region,
   wherein a lattice constant of the third source region and the third drain region is different from a lattice constant of the fourth source region and the fourth drain region.

6. The semiconductor device of claim 5, wherein:
   the first and second channel regions are made of Si or a Si-based compound, and
   the first and fourth source regions and the first and fourth drain regions are made of Ge or SiGe.

7. The semiconductor device of claim 6, wherein:
   the second and third source regions and the second and third drain regions are made of SiGe, and
   a Ge content of the second and third source regions and the second and third drain regions is smaller than a Ge content of the first and fourth source regions and the first and fourth drain regions.

8. A semiconductor device, comprising a p-channel gate-all-around field effect transistor (p-GAA FET) and an n-channel gate-all-around around field effect transistor (n-GAA FET), wherein:
   each of the p-GAA FET and the n-GAA-FET comprises:
   a fin structure disposed over a substrate;
   a gate structure partially covering the fin structure; and
   a source and drain (S/D) structure formed over the fin structure not covered by the gate structure,
   the gate structure of each of the p-GAA FET and the n-GAA-FET includes:
   a first channel region disposed over the substrate and extending in a first direction;
   a gate dielectric layer disposed on the first channel region; and
   a gate electrode layer disposed on the gate dielectric layer, and in the p-GAA FET:
   the S/D structure includes a first S/D layer and a second S/D layer having a different lattice constant from the first S/D layer,
   the first S/D layer is connected to the first channel region along the first direction,
   the first S/D layer has a different lattice constant than the first channel region,
   a side face of the second S/D layer is in contact with the gate dielectric layer, and
   the second S/D layer includes a second source region and the first S/D layer includes a first source region completely surrounding the second source region when viewed in a cross section perpendicular to the first direction.

9. The semiconductor device of claim 8, wherein:
   the first channel regions are made of Si or a Si-based compound, and
   the first S/D layer is made of Ge or SiGe.

10. The semiconductor device of claim 9, wherein:
    the second S/D layer are made of SiGe, and
    a Ge content of the first S/D layer is greater than a Ge content of the second S/D layer.

11. The semiconductor device of claim 8, wherein multiple first channel regions and corresponding multiple first S/D layers are provided in a vertical direction.

12. The semiconductor device of claim 8, wherein, in the n-GAA-FET:
    the S/D structure includes a third S/D layer,
    the third S/D layer is connected to the first channel region, and
    the third S/D layer has a different lattice constant than the first channel region.

13. The semiconductor device of claim 8, wherein, in the n-GAA-FET, the S/D structure includes no layered structure.

14. A semiconductor device including a gate-all-around field effect transistor (GAA FET), the GAA FET, comprising:
    a first channel region disposed over a substrate;
    a second channel region disposed over the substrate at a different height than the first channel region;

a first source region and a first drain region disposed over the substrate and connected to the first channel region and the second channel region such that, along a first direction, the first channel region is disposed between the first source region and the first drain region and the second channel region is disposed between the first source region and the first drain region;

a gate dielectric layer disposed on the first channel region;

a gate electrode layer disposed on the gate dielectric layer; and a second source region and a second drain region disposed over the substrate, wherein:

the second source region and the second drain region are in contact with the gate dielectric layer, a lattice constant of the first source region and the first drain region is different from a lattice constant of the second source region and the second drain region, and when viewed in a cross section perpendicular to the first direction, the first source region completely surrounds the second source region, and the first drain region completely surrounds the second drain region.

15. The semiconductor device of claim 14, wherein the first source region wraps around the second source region, and the first drain region wraps around and contacts the second drain region.

16. The semiconductor device of claim 14, wherein:

a space is provided between the first channel region and the substrate in a vertical direction perpendicular to a surface of the substrate and between the second source region and the second drain region in a horizontal direction parallel to the surface of the substrate, and the space is filled with the gate dielectric layer and the gate electrode.

17. The semiconductor device of claim 14, wherein:

the first channel region is made of Si or a Si-based compound, and the first source region and the first drain region are made of Ge or SiGe.

18. The semiconductor device of claim 17, wherein:

the second source region and the second drain region are made of SiGe, and a Ge content of the second source region and the second drain region is smaller than a Ge content of the first source region and the first drain region.

19. The semiconductor device of claim 14, further comprising a third source region and a third drain region disposed on the substrate, and made of a same material as the second source region and the second drain region.

20. The semiconductor device of claim 19, wherein the third source region is sandwiched by the first source region and the substrate and the third drain region is sandwiched by the first drain region and the substrate.

* * * * *